United States Patent
Alping et al.

(10) Patent No.: US 6,380,600 B1
(45) Date of Patent: Apr. 30, 2002

(54) MICRO-ELECTROMECHANICAL ARRANGEMENT

(75) Inventors: Arne Alping, Kållered; Spartak Gevorgian, Göteborg, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 65 days.

(21) Appl. No.: 09/586,971

(22) Filed: Jun. 5, 2000

(30) Foreign Application Priority Data

Jun. 4, 1999 (SE) .............................................. 9902128

(51) Int. Cl.[7] .............................................. H01L 29/82
(52) U.S. Cl. ........................ 257/415; 257/421; 257/467
(58) Field of Search ................................ 327/415, 514; 331/177 V; 257/415, 431; 250/227.22, 214, 231.1

(56) References Cited

U.S. PATENT DOCUMENTS

| 3,798,508 A | 3/1974 | Kohashi | .................. | 317/234 R |
| 3,829,881 A | * | 8/1974 | Kohashi | ........................ | 357/23 |
| 3,911,297 A | 10/1975 | Merrin et al. | ................ | 307/311 |
| 6,242,989 B1 | * | 6/2001 | Barber et al. | ............ | 331/177 V |

FOREIGN PATENT DOCUMENTS

| EP | 0759628 | 2/1997 |
| WO | 9204735 | 3/1992 |

OTHER PUBLICATIONS

A. Dec et al, "Micromachined Varactor with WideTuning Range", Electronics Letters, vol. 33, No. 11, Mar. 1997.
Drangmeister, R.G. et al., "Fully Reconfigurable Microwave Millimetre Wave Circuits Using MEMS", High Frequency Silicon Micromachine and Multichip Intergration Workshop, sponsored by MTT-7 and RFIC, held at Baltimore Convention Center, Jun. 12, 1998.

* cited by examiner

Primary Examiner—David Nelms
Assistant Examiner—Tu-Tu Ho
(74) Attorney, Agent, or Firm—Burns, Doane, Swecker & Mathis, L.L.P.

(57) ABSTRACT

The present invention refers to a variable capacitor comprising a first conductive layer, a second conductive layer and a semiconductor layer, the first and second layers being arranged to be displaced relative to each other under the influence of an electrostatically generated force. The semiconductor layer constitutes a voltage generator, which when exposed to a radiation produces a voltage for charging the first and second conductive layers and induces the electrostatically generated force.

34 Claims, 5 Drawing Sheets

1

MICRO-ELECTROMECHANICAL ARRANGEMENT

This application claims priority under 35 U.S.C. §§119 and/or 365 to 9902128-9 filed in Sweden on Jun. 4, 1999; the entire content of which is hereby incorporated by reference.

BACKGROUND

The present invention relates to a micro-electromechanical switching arrangement with electrostatically controlled distance between at least a first and a second contact element arranged on a semiconductor layer, preferably provided on a substrate.

More specially, the present invention relates to a capacitive component with variable capacitance, and more specifically to a micro-electromechanical (MEM) capacitor having electrostatically controlled distance between first and second conductive layers arranged on a semiconductor layer, preferably provided on a substrate.

Known micromechanical switches comprise two connector arms which are brought together under influence of a force to make contact and conduct current through the as or other signal carriers arranged on the arms. The arms are usually made of two different materials having different thermal expansion coefficients. When the arms are exposed to heat, they bend because of the different thermal expansion coefficients and come into contact with each other or move further from each other. These types of switches need heating elements to heat the connecting arms.

Varactors are capacitors with voltage dependent capacitances. Semiconductor varactors are based on p-n, p-i-n or similar type of junctions, see for example "C.M. Cze, Physics of Semiconductor Devices".

In microwave applications, the quality factor (Q-factor) of semiconductor varactors degrades extremely with the increasing frequency due to the microwave losses both in doped semiconductor regions (dielectric losses) and metal-electrodes (conduction losses), Generally, in commercially available varactors the Q-factor is limited by about 10–20 above frequencies about 10–20 GHz and decreases with increasing frequency. Another disadvantage with semiconductor varactors is tat they are highly nonlinear devices, while in some microwave applications, e.g. in tunable filters, a high linearity is required A further disadvantage with semiconductor varactors is that although they operate at reverse bias conditions they have certain leakage currents, which increase with increased temperature or optical illumination (in the case where it is used as an optically controlled varactor).

To improve the quality factor and linearity a micromechanical varactor is proposed, for example in "Dec A., Suyama K., Micromechanical Varactor with a wide tuning range", Electronics Letters, Vol.33, pp. 922–924, 1997. In this varactor no semiconductor or dielectric layers are provided between the plates of the capacitor, resulting in higher Q-factor (limited by conduction losses only) and absence of non-linearity. Moreover, no leakage currents occur in the device according to this document as long as the applied voltages are lower that the breakdown voltage of the air. A schematic cross-sectional view of one embodiment of such a device 1 is illustrated in FIG. 1, The device 1 comprises a first (upper) thin metallic plate 2, a second (lower) thin metallic plate 3, a dielectric substrate 4 and terminals 5 and 6, and a dielectric layer 7. The metallic plates are distanced from each other at a distance d', which is $h'_a(v)+h'_d$, where $h'_a(v)$ is the thickness of the air gap, and $h'_d$ is the thickness of the dielectric layer 7. One end of the first plate 2 is fixed on a supporting part of the substantially L-shaped substrate 4 and the other end of it projects over the second plate 3 provided on a lower (horizontally projecting) part of the substantially L-shaped substrate. By applying an external voltage through the terminals 5 and 6, charges are generated on the metallic plates of the capacitor, Due to the large elasticity of at least one of the plates, and as a result of the electrostatic attraction force generated through the charges of opposite signs (negative on one and positive on the other plate), the free end of the first plate and the second plate are moved relative to each other.

A variable capacitor similar to the latter is also the subject of the European Patent Application No. 759 628.

The thin dielectric layer is arranged to avoid a short-circuit between the plates 2 and 3. As the result the total capacitance becomes:

$$C_{tot} = \frac{1}{\frac{1}{C_a} + \frac{1}{C_d}}$$

where $C_a$ is the capacitance of air=$(\epsilon_o S)/(h'_a(v))$, $C_d$ is the capacitance of the dielectric layer=$(\epsilon\epsilon_0 S)/h'_d$, $\epsilon$ is the dielectric constant of the dielectric layer, $\epsilon_0$ is the dielectric constant of air, S is the overlapping area of the plates, $h'_a(v)$ is the thickness of the air gap, and $h'_d$ is the thickness of the dielectric layer, The thickness $h'_a(v)$ is voltage dependent and consequently the $C_{EOE}$ too. Accordingly, the maximum capacitance ($C_{max}$) is obtained when $h_a(v)=0$, i.e. $C_{max}=C_d$. This means that the dielectric layer effectively reduces the tunability, i.e. the range of charges, of the capacitance. Consequently, the protecting dielectric layer becomes a disadvantage.

Furthermore, the dielectric layer 7 accumulates charge, which deteriorates the varactor performance. Moreover, when manufacturing a varactor, the arrangement of the dielectric layer is an extra moment.

In large arrays of capacitors used in some electronic circuits and particularly in large arrays of varactors (see for example: Drangmeister R.G. et al, "Fully Reconfigurable Microwave Millimeter wave Circuits Using MEMS" High Frequency Silicon Micromachining and Integration Workshop, MTT-S'98) the number of connector strips required to apply the control voltages to each of the individual capacitors increases with the number of capacitors, resulting in complex and less cost effective designs. Moreover, in microwave circuits the connecting DC strips significantly degrade the performance of the circuits based on arrays of electrically controlled micromechanical capacitors. This becomes a severe problem for MEM arrays used in microwave applications.

Non-micromechanical variable capacitances controlled by illumination are also known. U.S. Pat. No. 3,911,297, for example, teaches a variable capacitance diode comprising: a substrate of semiconductor material, a layer of glassy amorphous material disposed upon the said substrate and forming a diode junction. The layers exhibit different kinds of electronic conductivity. The diode further includes first and second conductive means for making ohmic contact with the said substrate and layer of glassy amorphous material respectively, and a source of controllable intensity light optically coupled to the said diode junction for supplying light to the junction. Means are arranged for varying the intensity of the light from the light source thereby varying the capacitance between said first and second conductive means by changing the characteristics of the substrate. Similar devices are also known through the international patent application no. WO 92/04735.

SUMMARY

The main objective with the present invention is to overcome the previously mentioned drawbacks connected with the devices according to the prior art.

One main object of the present invention is to provide a micro-electromechanical device, which can be actuated optically.

Another main object of the present invention is to provide an optically controlled variable micro-electromechanical capacitance, a so-called varactor, in which the conductors connected to an external driving source (e.g. a DC driving source) are eliminated.

Another object of the present invention is to improve the electrical performance of the varactor, provide a highly linear device, with low or no leakage currents.

Still, another object of the invention is to keep the microwave losses low (high Q-factor) in microwave applications.

One further major object of the present invention is to provide a micro-electromechanical varactor, which is less responsive to short-circuit.

Moreover, the device according to the invention is simple to design and fabricate (preferably using conventional fabrication processes), which makes the device more cost-effective.

For these reasons, in the initially mentioned capacitor said semiconductor layer constitutes a voltage generator, which when exposed to a radiation produces a voltage charging said first and second conductive layers and induces said electrostatically generated force. Preferably, said semiconductor layer comprises a high conductivity p$^+$ or n$^+$ type semiconductor layer, a substantially high resistivity n or p layer and a n$^+$ or p$^+$ layer. Alternatively, the semiconductor layer consists of a Schottky barrier, p-n or p-i-n diodes. In a preferred embodiment the first conductive layer is deposited on the high conductivity layer and the second conductive layer is deposited on the high resistivity layer. Moreover, the second conductive layer is insulated electrically from the high resistivity layer by a dielectric (oxide) layer and the second conductive layer is galvanically connected to the n$^+$ or p$^+$ layer through a via, which is electrically insulated from the n layer by means of surrounding walls, which are made of a dielectric (oxide) layer. Preferably, at least said second layer preferably, which is of a dielectric material, is provided with a coating for preventing short-circuit between the plates.

To prevent short circuit between the plates, in one preferred embodiment, an internal resistance between p$^+$ and n$^+$ layers and an internal capacitance of p$^+$-n-n$^{30}$ structure are provided which result in that when the plates of the variable capacitor are short-circuited, a short-circuit current is generated, which results in a voltage drop basically equal to an open circuit photo voltage resulting in a reduction of the voltage on the plates of the capacitor and accordingly reduction of the electrostatically generated force between the plates. Preferably, said resistance is at least partly varied by varying at least a portion of a cross-section at least one of said layers.

In an advantageous embodiment the semiconductor substrate layer consists of Silicon, GaAs, InP etc. and the entire variable capacitance is arranged on a substrate consisting of metal, semiconducting or dielectric material.

To expose the semiconductive layer to the radiation, said first conductive layer is transparent to radiation or arranged with apertures. An one alternative embodiment, the semiconductive layer is exposed to said radiation from side sections or a bottom section.

Preferably, to minimise the losses of the optical power, the thickness of the p$^+$/n$^+$ layer is chosen to be smaller or comparable to an optical penetration depth of the material at the wavelength of the controlling radiation signal. Preferably, the wavelength, λ, of the radiation is defined by $$\lambda = \frac{1.24}{E_g},$$

where $E_g$ is the band gap of the high resistivity layer. Most preferably, the radiation is an optical illumination, which has an illumination intensity and said intensity and/or a cross sectional area of an illuminating beam and/or illuminated area is variable. Advantageously, the optical illumination has a CW (Continues Wave) component to set an initiated value of the capacitance, and a variable fraction of the illumination changes the capacitance about a fixed initiated value.

In one alternative embodiment, two semiconducting junctions are connected in series to increase the photo-voltage supplied to the capacitors.

In a low pass filter including a variable capacitance according to the invention and an inductance, the variable capacitance comprising a first conductive layer, a second conductive layer and a semiconductor layer, said fist and second layers being arranged to be displaced relative each other under influence of an electrostatically generated force, and said semiconductor layer constitutes a radiation detector, which when exposed to a radiation produces a voltage charging said first and second conductive layers and induces said electrostatically generated force.

The micro-electromechanical switching arrangement according to the invention comprises a first connector member, a second connector member and a semiconductor layer, said connector members is arranged to be displaced relative each other under influence of an electrostatically generated force. The semiconductor layer constitutes a voltage generator, which when exposed to a radiation produces a voltage charging said first and second connector members and inducing said electrostatically generated force.

BRIEF DESCRIPTION OF THE DRAWINGS

In the following, the invention will be further described in a non-limiting way with reference to the accompanying drawings, in which.

DETAILED DESCRIPTION

Figure 14:
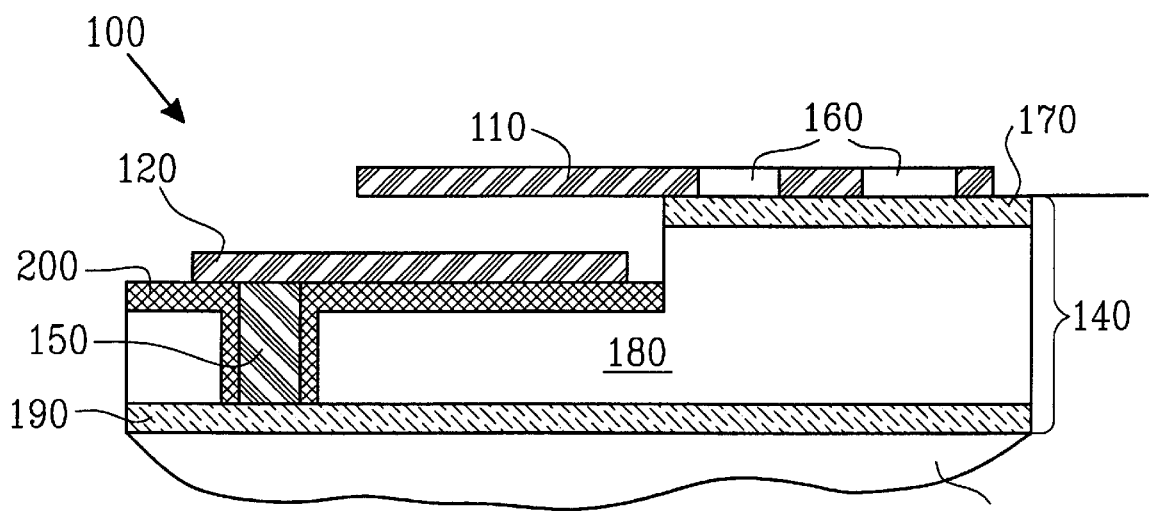
FIG. 14 schematically shows a cross-section through a micro-electromechanical switch according to the invention.

FIG. 14 illustrates a micro-electromechanical (MEM) swing device 100 according to the invention. The device 100 comprises a first (upper) thin metallic plate 110, a second (lower) thin metallic plate 120, a substrate 130, a semiconductor layer 140, a via 150 and radiation transmission apertures 160. The semiconductor layer 140 comprises a high conductivity $p^+$ type semiconductor layer 170, a resistivity n layer 180 and a $n^+$ layer 190. The layer 140 consists of a main portion and a step projecting from the main portion, The semiconductor substrate layer is lade of Silicon, GaAs, InP etc., and the substrate 130 consists of metal, semiconducting or dielectric material.

The metallic plates act as contact-breaker arms of the switch. The first arm 110 is deposited on top of the high conductivity $p^+$ layer on the main portion. The second arm 120 is deposited on the step shaped section of the n layer. The second arm 120 is separate from the first one by a small air or vacuum gap. It is insulated electrically from the n layer by a dielectric (oxide) layer 200. The second arm 120 is galvanically connected to the $n^+$ layer through the via 150. The via 150 is electrically insulated from the n layer by means of surrounding walls of dielectric (oxide) layer. The first and second arms 110 and 120, respectively, also constitute the switching elements of the switch, e.g. a microwave switch.

The semiconductor $p^+$ and n layers form a $p^+$-n junction with an internal build-in voltage. The first arm 110 is partially removed providing apertures for the passage of radiation from a source (not shown) onto the $p^+$ layer. When for example an optical-signal illuminates the surface of the $p^+$ layer, the radiation penetrates the semiconductor $p^+$ layer and reaches n layer 180, it generates extra free charge carriers and induces a (photo) voltage on the plates of the varactor. The induced photo-voltage is applied to the arms 110 and 120, generating charges of opposite sign on the plates. Due to this charge, an electrostatic attraction force (or repletion force, e.g. due to the mechanical elasticity of the arms) between the arms is generated.

Figure 1:
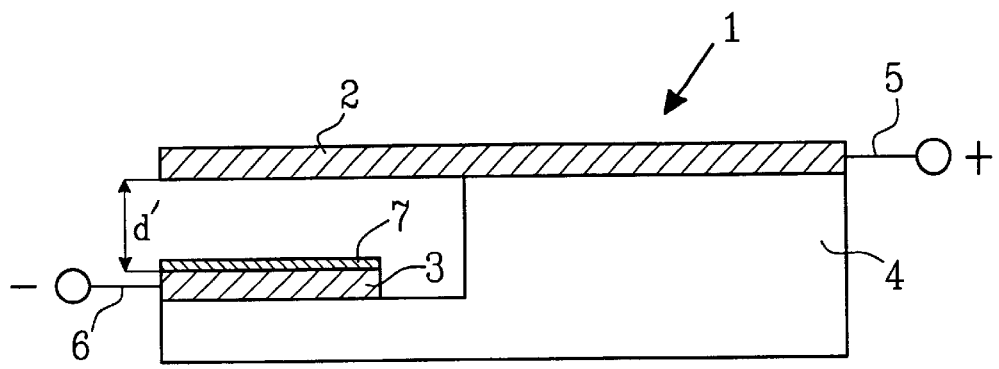
FIG. 1 schematically illustrates a cross-section through a device according to the prior art.
Figure 2:
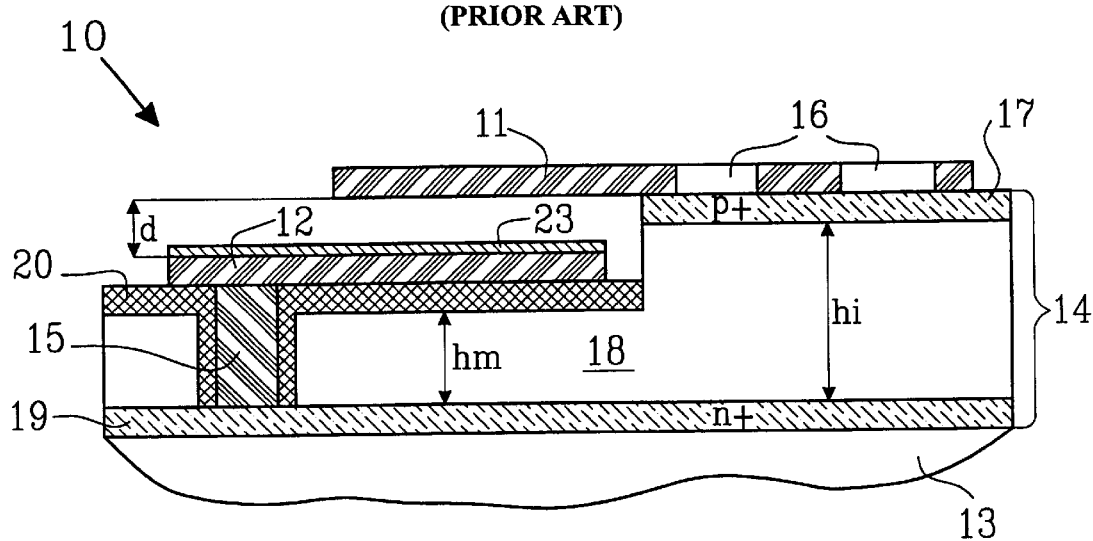
FIG. 2 is a schematic cross-section of a variable capacitance diode (varactor) in accordance with the present invention.
Figure 3:
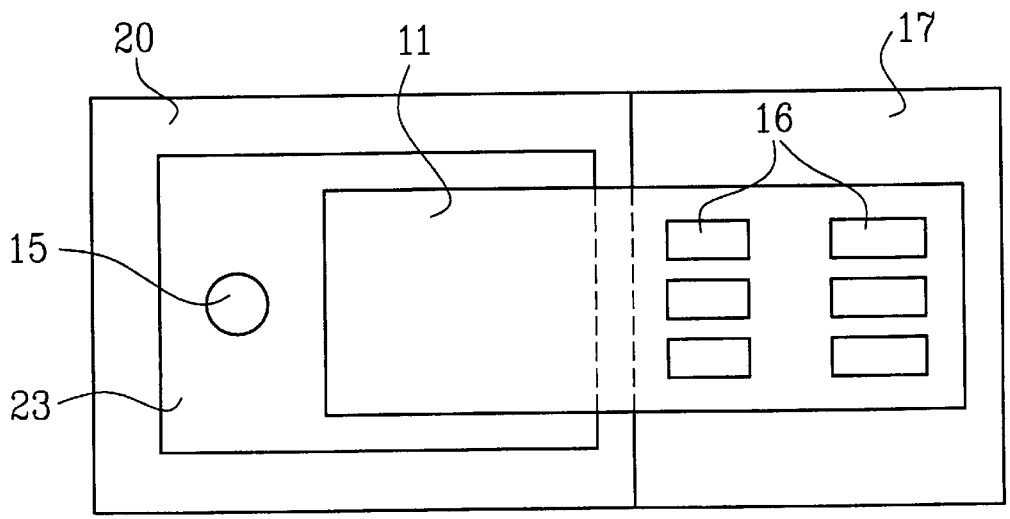
FIG. 3 is a schematic elevation view of the varactor of FIG. 2.

FIGS. 2 and 3 illustrate a device according to the second aspect of the invention, FIG. 2 is a schematic cross-section of a micro-electromechanical varactor 10, according to the invention and FIG. 3 is a view from above over the same varactor. The varactor 10 comprises a first (upper) thin metallic plate 11, a second (lower) thin metallic plate 12, an insulating dielectric layer 23, a substrate 13, a semiconductor layer 14, a via 15 and radiation transmission apertures 16. The semiconductor layer 14 comprises a high conductivity $p^+$ type semiconductor layer 17. a high resistive n layer 18 ad a $n^+$ layer 19. The layer 14 is arranged with a first main surface, a second main surface distanced from the first main surface in the depth direction of the layer 14 and a third main surface at the other side of the layer opposite said first and second main surfaces, The semiconductor substrate layer consists of Silicon, GaAs, InP etc., and the substrate 13 consists of metal, semiconductor or dielectric material.

The first metallic plate 11 of the varactor is deposited on the first main surface, on top of the high conductivity $p^+$ layer on the main portion The second metallic plate 12 is deposited on the second main surface, on he n layer. The second thin film metallic plate 12 is separated from the first one by a small air gap having distance, $d_i$, which is $h_a(v)+h_d$, where $h_a(v)$ is the thickness of the air gap, and $h_d$ is the thickness of the dielectric layer. It is insulated electrically from the n layer by a dielectric (oxide) layer 20. The dielectric layer 23 (<0.5 μm) is arranged to prevent a short-circuit between the plates 11 and 12. However, this layer is not necessary in every embodiment, which will be discussed more closely later.

The second plate 12 is galvanically connected to the $n^+$ layer through the via 15. The via 15 is electrically insulated from the n layer by means of surrounding dielectric (oxide) walls.

The semiconductor $p^+$ and n layers form a $p^+$-n junction with an internal build-in voltage according to formula (1):

$$V=(KT/q)\ln(n\, p^+/n_i^2) \qquad (1)$$

where K is the Boltzman's constant,

T is the operation temperature, $n_i$, n and $p^+$ are charge densities in $n_i$, n and $p^+$ layers, and q is the electronic charge.

Sections of the first plate 11 are removed, as shown in FIG. 3, providing apertures for passage of radiation from a source (not shown) onto the $p^+$ layer. When, for example an optical signal illuminates the surface of the $p^+$ layer 17, it penetrates the $p^+$ 17 and reaches the n layer 18 and generates extra free charge carriers, which induce a (photo)voltage on the plates of the varactor by virtue of photovoltaic effect (see for example C.M Cze, Physics of Semiconductor Devices).

The maximum photo-generated voltage is defined by formula (1). It is basically less than 1 volt. The thickness of the $p^+$ layer is chosen to be smaller or comparable to the optical penetration depth in these materials at the wavelength of the controlling optical signal, so that the losses of the optical power are minimised. For the same reason, the plate 11 on top of the $p^+$ layer may be optically transparent or else, as shown, it can be provided with apertures to allow the optical illumination to reach the semiconducting $p^+$ layer.

$$\lambda = \frac{1.24}{E_g},$$

where $E_g$ is the band gap of the semiconductor layer 18. Also, white light, variable illumination, modulated illumination etc., can be used.

To keep the microwave losses low, the doping levels in $p^+$ and $n^+$ layers should be as high as possible, and the doping level in n layers should be as low as possible. The thickness of n layer, $h_i$, is adopted to the conditions of low microwave loss, low capacitance of entire $p^+$-n-$n^+$ structure and high photovoltaic. The thickness $h_m$ ($\approx h_i-d$) is defined by given zero voltage bias capacitance of the varactor and from the required minimum value of control voltage (i.e. photovoltage). For voltages about 1 to 50 V the $h_m$ can be chosen so that the air gap d is in the range of about 0.5 to 5.0 μm.

When the $p^+$ layer is exposed to the optical illumination, the induced photovoltage is applied to the plates 11 and 12 of the varactor generating charges of opposite sign on the plates. Due to this charge an electrostatic attraction (or repletion) between the plates of the varactor is generated, which displaces the plates and varies the distance d between the plates and consequently the capacitance according to a simple relationship $C=\epsilon_0 S/d$, where $\epsilon_0$ is the dielectric constant of the vacuum, S is the area of the plate and d is the distance between the plates.

By varying the intensity of the optical illumination a=&or the cross sectional area of illuminating beam and/or illuminated area, it is possible to vary the amount of the photo-generated voltage, and thus, the capacitance of the varactor. The open circuit photovoltage V (in this case the same as the voltage on the plates of the varactor) developed across a simple p-n junction is given by:

$$V=(KT/q)\ln(1+I_L/I_s) \quad (2)$$

where K is the Boltzman's constant,

T is the operation temperature, q is the electronic charge $I_s$ is the saturation current and characterises given p-n junction, and $I_L$ is a parameter (in units of current) proportional to the absorbed optical power.

The optical illumination may have a CW (Continues Wave) component to set an initial value of the capacitance. Then the variable fraction of the illumination will change the capacitance, i.e. to modulate the capacitance, about the fixed initial value.

Figure 4:
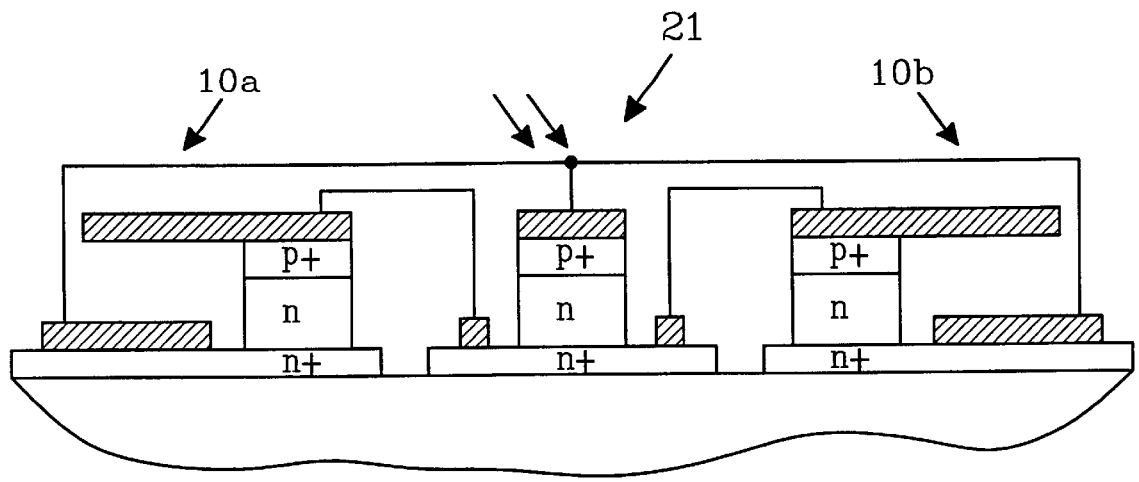
FIG. 4 is a schematic cross-section of serially connected capacitances according to the invention.

In the embodiment shown in FIG. 4, two semiconducting $p^+n$ junctions are connected in series to increase the photovoltage supplied to the varactors 10a and 10b. Furthermore, FIG. 4 demonstrates that same $p^+n$ junctions 21 may be used to actuate two (or more) varactors at the same time. Each varactor 10a and 10b has the same configuration as the varactor described in conjunction with description of FIG. 2.

Figure 5:
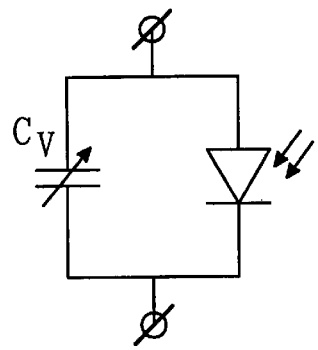
FIGS. 5–11 are various equivalent circuit representations of the capacitance, according to the invention.

The equivalent circuit representations of the varactor are shown in FIGS. 5 and 6. In FIG. 5, the circuit comprises a radiation detector, such as a photodetector, e.g. a photodiode, parallel with the varactor. FIG. 6 represents, in more detail, a microwave equivalent circuit, in which the capacitance $C_D$ and the resistance R of the photodetector are taken into consideration. The terminals of the circuits are assumed to be microwave terminals.

Preferably, the varactor is designed so that the conditions (i) and (ii) are fulfilled:

$$X_V \ll X_D, \quad (i)$$

$$X_V \ll R, \quad (ii)$$

where $X_V=1/(\omega C_V)$, $X_D=1/(\omega C_D)$, $\omega=2\pi$, f: is the frequency of a microwave signal, $C_V$ is the capacitance of the varactor, $C_D$ is the capacitance of $p^+$-n-$n^+$ structure, and R is the equivalent microwave resistance of the photodetector.

As mentioned earlier the varactor (or the switch) according to the present invention is not critical to the short-circuit between the plates contrary to the known varactors, which are controlled by a voltage source. According to the equivalent circuit diagram of FIG. 6a, which is a modification of the circuit diagram of FIG. 6b in which $r_b$ represents the resistance of $p^+$ and $n^+$ layers and $C_D$ is the capacitance of $p^+$-n-$n^+$ structure. In a normal state, there is no current flowing in the circuit and consequently no voltage drop over $r_b$ exists. All open circuit voltage is applied to the varactor. When the plates of the varactor are short-circuited, a short-circuit current $I_{sc}$ is generated. which results in a voltage drop $V_{sc} \approx r_b * I_{sc}$, basically equal to the open circuit photo voltage according to formula (1). This results in a reduction of the voltage on the plates of the varactor and accordingly reduction of the attraction force between the same.

Practically, no current equal to a short-circuit current can be generated and a short-circuit is prevented. For this reason the dielectric layer 23 may be eliminated as mentioned above.

It is obvious that the $p^+$-n-$n^+$ structures can be reordered and the illumination may be applied from the bottom or side surfaces of the structure. Alternatively the $p^+$-n-$n^+$ structure may be replaced by a $n^+$-p-$p^+$ structure.

It is also clear that the varactor may be arranged in a suitable location in a complex integrated circuit arrangement and it may be optically actuated, for example by an optical fibre, focussing lenses etc., without affecting the performance of other circuits in the arrangement.

Figure 8:
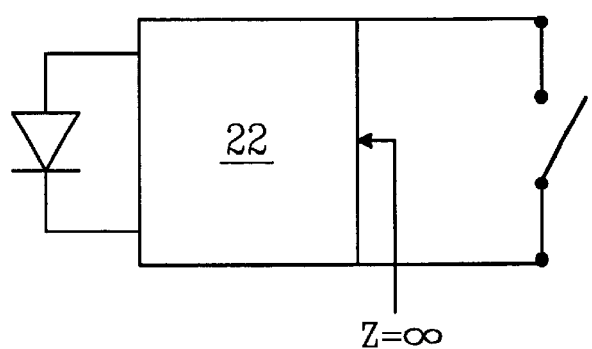
Figure 9:
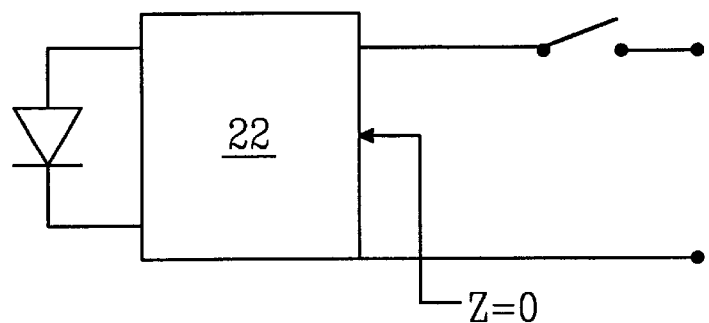
Figure 10:
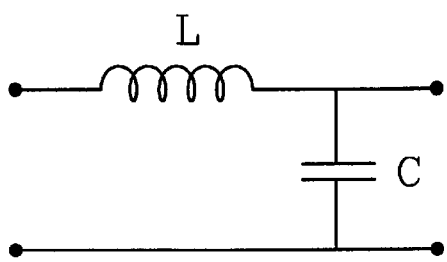
Figure 11:
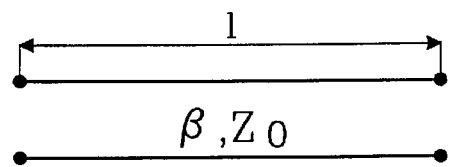

Instead of $p^+$-n-$n^+$ or $n^+$-p-$p^+$ structures (generally known as p-i-n diodes) mentioned above, it is possible to employ other semiconducting devices, such as Schottky barrier, p-n diodes or the like, to generate open circuit photovoltaic. Usually the microwave impedance and Q-factor of these diodes are smaller compared with p-i-n diodes. To reduce the negative effects of these diodes on the microwave performance of a varactor 10, transformers 22 must be used between these diodes and the varactor, as shown in FIGS. 8 and 9. The transformer itself may have a well known electrical or physical structure (see for example R.E. Collin, Foundations for Microwave Engineering, McGrawHill, N.Y.). Particularly, it may be a low-pass filter based on lumped inductors and capacitors for frequencies f<10 GHz as shown in FIG. 10. At higher frequencies, e.g. f>10 GHz, it may be apart of a transistor line, as shown in FIG. 11. The length l and the impedance, $Z_0$, of the line are chosen using standard impedance transformation formula:

$$Z = Z_o \frac{Z_o + jZ_o \tan\beta l}{Z_o + jZ_D \tan\beta l}$$

where $$Z_D = \left(\frac{1}{jX_D} + \frac{1}{R}\right)^{-1},$$

$\beta$ is the propagation constant, and $X_D$ is the imaginary part of the diode's impedance For given $Z_D$, $\beta$, l and $Z_0$, of the line is chosen so that $Z \to \infty$ as it is shown in FIG. 8. In respect of FIG. 9, $\beta$, l and $Z_0$ are chosen so that the transformation gives $Z \to 0$.

Figure 12:
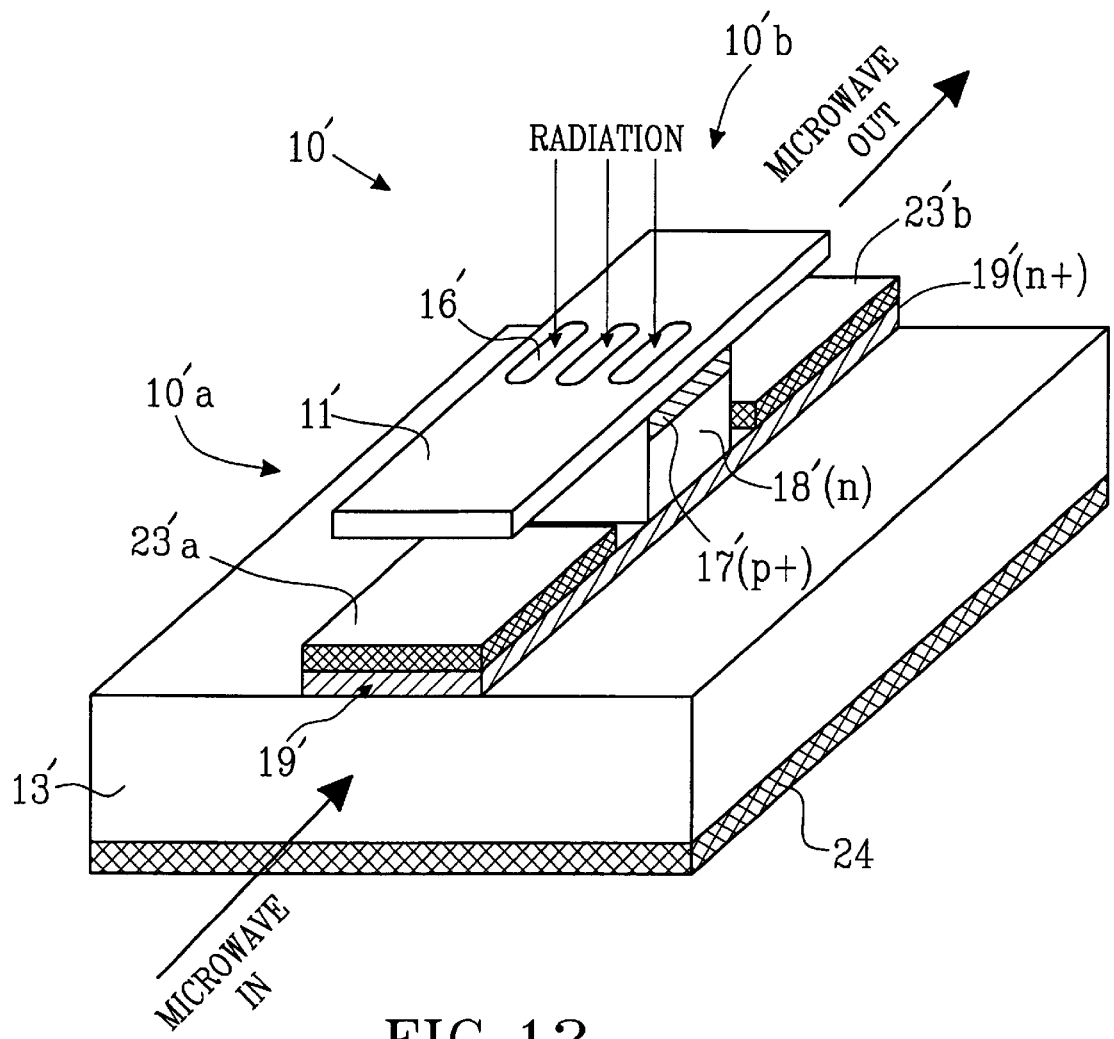
FIG. 12 is a schematic perspective view of another embodiment of device according to the invention.
Figure 13:
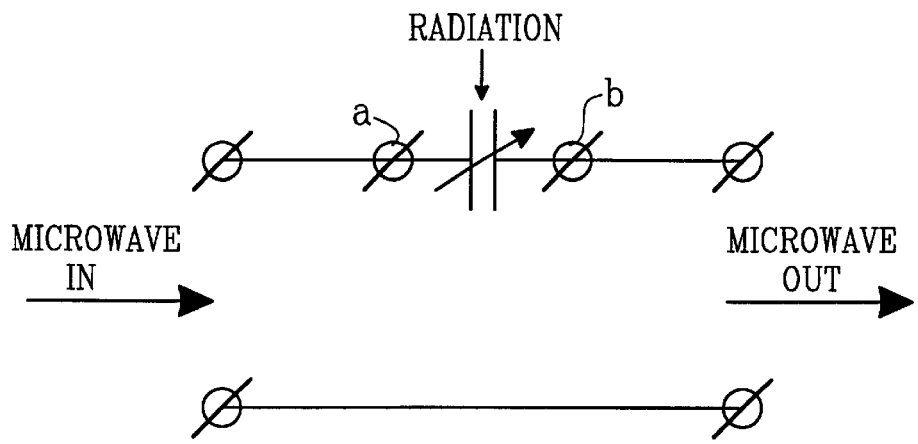
FIG. 13 is equivalent circuit representation of the embodiment according to FIG. 12.

One embodiment implementing a varactor (or switch) according to the invention is illustrated in FIG. 12 with its equivalent circuit diagram shown in FIG. 13. The varactor (switch) 10' is arranged as a simple microstrip in a microwave (or other electromagnetic) application, in which the microwaves pass through the substrate 13', e.g. a high resistivity silicon substrate, which is arranged on a ground plane 24, e.g. of a conductive material such as gold (Au). This particular embodiment also illustrates another way to form the varactor, which consist of two serially connected varactors, 10'a and 10'b, comprising a common conductive plate 11' and common $n^+$ layer 19'. A $p^+$-n junction 17'; 18' is arranged substantially in the central region of the plate 19' and similar to previously described embodiments, the top plate 11' is arranged on the $p^+$-n junction. Each varactor 10'a and 10'b is provided with the corresponding second plate 12'a and 12'b, respectively. Also, protective layers (not shown) may be applied. In this case, the thickness $h_m$, according to FIG. 2, is substantially zero. The top plate 11' is arranged with apertures 16' for exposing the layer 17 to tee radiation/illumination. The terminals a and b in FIG. 13 represent the varactor terminals.

Figure 6A:
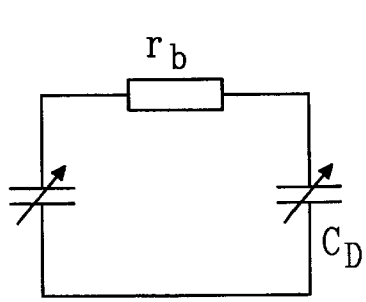
Figure 6B:
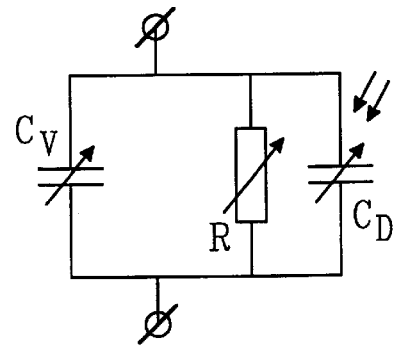
Figure 7:
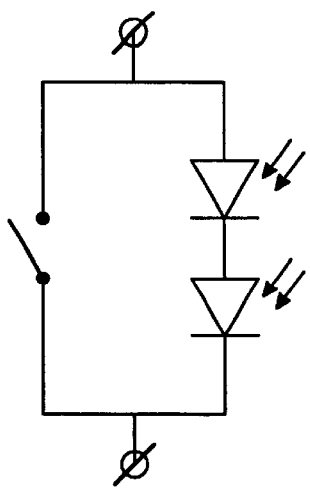

Moreover, each section 25 of layer 19' between the region of the layer 19' covered by each plate 12'a and 12'b constitute a part of the resistance $r_b$, according to FIG. 6a, which implies that the by varying cross-section of at least this section resistance $r_b$. can be varied.

The invention is not limited to the shown embodiments but can be varied in a number of ways without departing from the scope of the appended claims and the arrangement and the method can be implemented in various ways depending on application, functional units, needs and requirements etc. In one embodiment, for example, it is possible to ate a first common plate for two $p^+$-n junctions covering a second colon plate. Moreover, essentially all relevant features of the varactor mentioned above and in the claims Say be applied to or used with the switching device according to the first aspect of the invention

What is claimed is:

1. A variable capacitor, comprising:
   a first conductive layer;
   a second conductive layer;
   a semiconductor layer,
   the first and second conductive layers being arranged to be displaced relative to each other under influence of an electrostatically generated force,
   wherein the semiconductor layer constitutes a voltage generator, which when exposed to a radiation, produces a voltage charging the first and second conductive layers and induces the electrostatically generated force.

2. The variable capacitor of claim 1, wherein the semiconductor layer comprises:
   a high conductivity $p^+$ type semiconductor layer;
   a substantially high resistivity n layer; and
   an $n^+$ layer.

3. The variable capacitor of claim 2, wherein the first conductive layer is deposited on the high conductivity layer.

4. The variable capacitor of claim 2, wherein the second conductive layer is deposited on the high resistivity layer.

5. The variable capacitor of claim 2, wherein the second conductive layer is insulated electrically from the high resistivity layer by a dielectric oxide layer.

6. The variable capacitor of claim 2, wherein the first conductive layer is transparent to radiation or arranged with apertures for exposing the semiconductive layer to the radiation.

7. The variable capacitor of claim 2, wherein the semiconductive layer is exposed to the radiation from side sections or a bottom section.

8. The variable capacitor of claim 2, wherein the thickness of the $p^+/n/n^+$ layer is chosen to be smaller or comparable to an optical penetration depth of the material at the wavelength of the controlling radiation signal.

9. The variable capacitor of claim 2, wherein the second conductive layer is galvanically connected to the $n^+$ layer through a via.

10. The variable capacitor of claim 9, wherein the via is electrically insulated from the n layer by means of surrounding walls.

11. The variable capacitor of claim 10, wherein the walls are of a dielectric (oxide) layer.

12. The variable capacitor of claim 1, wherein the semiconductor layer comprises:
    a high conductivity $n^+$ type semiconductor layer;
    a substantially high resistivity p layer; and
    a $p^+$ layer.

13. The variable capacitor of claim 9, wherein second conductive layer is galvanically connected to the $p^+$ layer through a via.

14. The variable capacitor of claim 13, wherein the via is electrically insulated from the n layer by means of surrounding walls.

15. The variable capacitor of claim 12, wherein the thickness of the $p^+/n/n^+$ layer is less than or comparable to an optical penetration depth of the material at the wavelength of the controlling radiation signal.

16. The variable capacitor of claim 15, wherein the radiation is an optical illumination.

17. The variable capacitor of claim 16, wherein the optical illumination has a continuous wave component to set an initiated value of the capacitor, and a variable fraction of the illumination changes the capacitor about a fixed initiated value.

18. The variable capacitor of claim 1, wherein the semiconductor layer consists of a Schottky barrier, p-n or p-i-n diodes.

19. The variable capacitor of claim 1, wherein the internal resistance between $p^+$ layers and an internal capacitor of $p^+$-n-$n^+$ structure is provided, such that when the plates of the variable capacitor are short-circuited, a short-circuit current is generated, which results in a voltage drop approximately equal to an open circuit photo voltage resulting in a reduction of the voltage on the plates of the varactor and reducing the electrostatically generated force between the plates.

20. The variable capacitor of claim 19, wherein the resistance is at least partly varied by varying at least a portion of a cross-section one of at least one of the layers.

21. The variable capacitor of claim 1, wherein at least the second layer, preferably of a dielectric material, is provided with a coating for preventing short-circuit.

22. The variable capacitor of claim 1, wherein the semiconductor substrate layer consists of Si, GaAs, or InP.

23. The variable capacitor of claim 1, wherein the variable capacitor is arranged on a substrate consisting of metal, semiconducting or dielectric material.

24. The variable capacitor of claim 1, wherein the wavelength, $\lambda$, of the radiation is defined by $\lambda=1.24/E_g$, where $E_g$ is the band gap of the high resistivity layer.

25. The variable capacitor of claim 24, wherein the illumination has an intensity, and the intensity and/or a cross sectional area of an illuminating beam and/or illuminated area is variable.

26. The variable capacitor of claim 25, wherein the optical illumination has a continuous wave component to set an initiated value of the capacitor, and a variable fraction of the illumination changes the capacitor about a fixed initiated value.

27. The variable capacitor of claim 24, wherein two semiconducting junctions are connected in series to increase the photo-voltage supplied to the capacitors.

28. A low pass filter including a variable capacitor and an inductance, wherein the variable capacitor comprises:
    a first conductive layer;
    a second conductive layer;
    and a semiconductor layer; and
    first and second layers being arranged to be displaced relative to each other under influence of an electrostatically generated force, wherein
    the semiconductor layer includes a radiation detector, which when exposed to a radiation produces a voltage charging the first and second conductive layers and induces the electrostatically generated force.

29. A micro-electromechanical switching arrangement comprising:
    a first connector member;
    a second connector member;
    a semiconductor layer;
    the connector members arranged to be displaced relative to each other under influence of an electrostatically generated force, wherein the semiconductor layer constitutes a voltage generator, which when exposed to a radiation produces a voltage charging the first and second connector members and inducing the electrostatically generated force.

30. The switching arrangement of claim 29, wherein the semiconductor layer comprises:
   a high conductivity $p^+$ type semiconductor layer;
   a substantially high resistivity n layer; and
   an $n^+$ layer.

31. The switching arrangement of claim 30, wherein a first conductive layer is deposited on top of the high conductivity $p^+$ layer.

32. The switching arrangement of claim 30, wherein a second conductive layer is deposited on a step shaped section of the n layer.

33. The switching arrangement of claim 29, wherein the semiconductor layer consists of a Schottky barrier or p-n diodes.

34. The switching arrangement of claim 29, wherein the second conductive members are provided with contact means.

* * * * *